United States Patent [19]
Abbas et al.

[11] 4,044,452
[45] Aug. 30, 1977

[54] PROCESS FOR MAKING FIELD EFFECT AND BIPOLAR TRANSISTORS ON THE SAME SEMICONDUCTOR CHIP

[75] Inventors: Shakir Ahmed Abbas, Wappingers Falls; Robert Charles Dockerty, Poughkeepsie, both of N.Y.

[73] Assignee: International Business Machines Corporation, Armonk, N.Y.

[21] Appl. No.: 729,937

[22] Filed: Oct. 6, 1976

[51] Int. Cl.$^2$ .............................................. B01J 17/00
[52] U.S. Cl. ..................................................... 29/571
[58] Field of Search ................... 29/571, 577; 357/43, 357/50

[56] References Cited

U.S. PATENT DOCUMENTS 3,955,269   5/1976   Magdo et al. ........................... 29/577

Primary Examiner—Gerald A. Dost
Attorney, Agent, or Firm—James M. Thomson

[57] ABSTRACT

A process and the resulting structure for making metal oxide silicon field effect transistors and vertical bipolar transistors on the same semiconductor chip with the devices being dielectrically isolated from each other. The process does not require an epitaxial layer. The bipolar devices have utility as cross-chip or off-chip drivers or can be utilized for analog circuitry.

7 Claims, 7 Drawing Figures

PROCESS FOR MAKING FIELD EFFECT AND BIPOLAR TRANSISTORS ON THE SAME SEMICONDUCTOR CHIP

Background of the Invention

The present invention relates to a process for making both field effect and bipolar transistors on the same semiconductor chip. More particularly, the invention discloses a particular process for making metal oxide silicon field effect transistors and vertical bipolar transistors on the same semiconductor chip with the devices being dielectrically isolated.

Various processes and schemes have been utilized in the prior art to produce semiconductor chips incorporating transistors and passive devices in isolated relationship upon the same semiconductor ship. In similar fashion, semiconductor chips are known that utilize both field effect transistors and bipolar transistors on the same chip. For example, U.S. Pat. No. 3,648,125 to Peltzer discloses a method of fabricating integrated circuits with oxidized isolation wherein a thin silicon epitaxial layer is subdivided into electrically isolated pockets by a grid of oxidized regions of epitaxial silicon material which extend through the epi layer to a laterally extending P-N junction.

Such schemes are suitable for many purposes and are well recognized as being functional. However, a need exists in the art for an improved process for forming semiconductor devices of both field effect and bipolar type on the same semiconductor chip, which are isolated from each other, in a less complicated fashion than was heretofore practiced. A simplified process using newer processing techniques can be translated into cheaper components.

SUMMARY OF THE INVENTION

Accordingly, it is an object of the present invention to provide an improved process and the structure resulting therefrom which permits fabrication of metal oxide silicon field effect transistors and vertical bipolar transistors on the same semiconductor chip, which process does not require an epitaxial layer.

The process includes the steps of providing a silicon monocrystalline substrate, etching and oxidizing the silicon in areas selected to be dielectric regions for isolating the field effect transistor devices to form first oxidized areas, etching the silicon in other areas selected to be the dielectric regions isolating the bipolar devices to form a mesa in the center of said etched area and oxidizing the exposed silicon areas to form said oxidized areas, ion implanting impurities through the second oxidized area to form a subcollector for the bipolar devices and growing thick silicon dioxide in the first and second oxidized areas to fill the etched areas and complete the dielectrically isolated regions, then forming the source, drain of the field effect devices and the emitter regions of the bipolar devices, forming the gate contacts for the field effect devices, after which electrical contacts to the respective electrodes of the devices are formed.

BRIEF DESCRIPTION OF THE DRAWINGS

These features and other features and advantages of the invention are set forth in the following detailed description of the invention and the accompanying drawings wherein.

Detailed Description of the Invention

Figure 2:
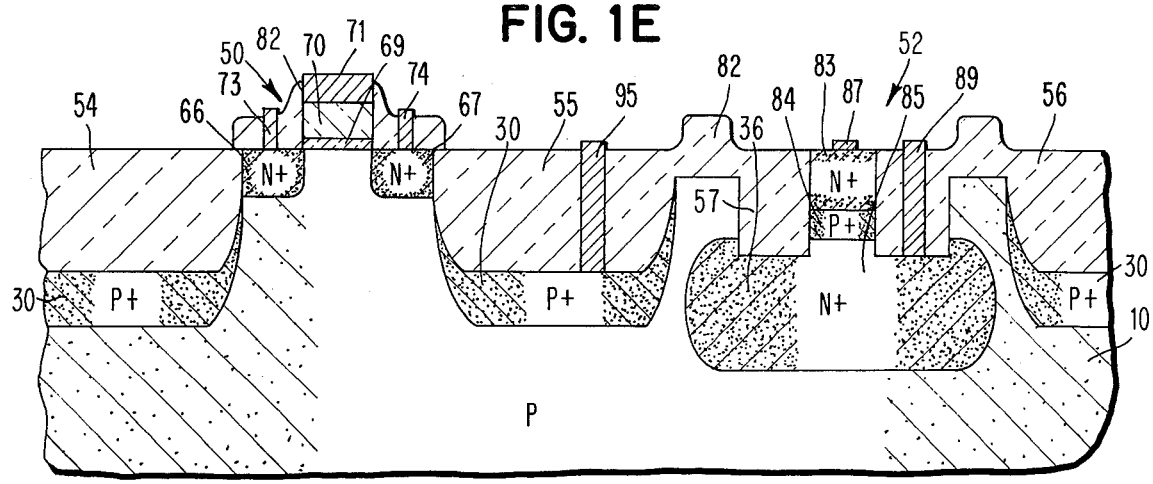
FIG. 2 is a cross sectional view of a semiconductor chip illustrating one preferred embodiment of the present invention.
Figure 3:
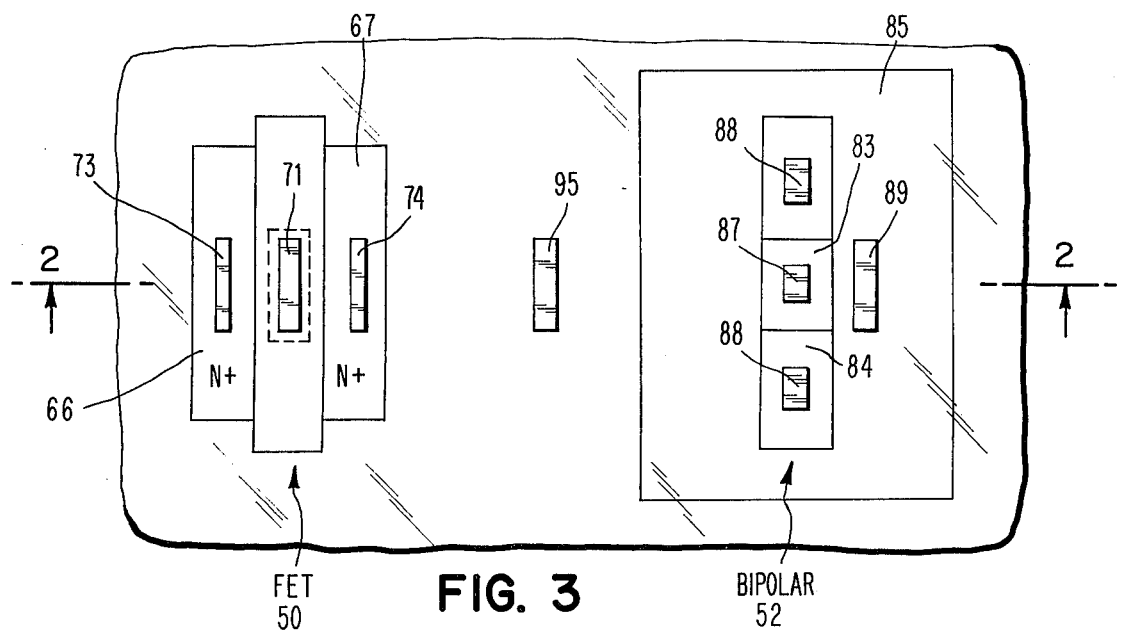
FIG. 3 is a fragmentary top sectional view of a portion of the semiconductor chip illustrated in FIG. 2, also showing one preferred embodiment of the invention.

Referring now to the drawings and particularly to FIGS. 2 and 3 one preferred embodiment of the invention is illustrated in connection with the fragmentary section 10 of a silicon chip. In particular, a metal oxide silicon field effect transistor 50 is formed in chip 10 along with a vertical bipolar transistor 52. The transistors are isolated by dielectric areas or regions 54, 55, 56, 57.

Referring particularly to FIG. 2, field effect transistor 50 includes a source region 66 and a drain region 67 associated with a gate structure including a silicon dioxide layer 69 and a silicon layer 70 having a gate electrode 71 associated therewith. In similar fashion, source 66 is provided with a source electrode 73 and drain 67 is provided with a drain electrode 74, in well known fashion. Thus, field effect transistor 50 structurally is comprised of N+ source and drain regions formed with a P semiconductor layer. In the preferred embodiment, the silicon chip is of P type silicon having a (100) crystal orientation and a typical resistivity of about 2 ohms-centimeter. However, it should be recognized that other resistivities could be utilized if preferred and that opposite conductivity type silicon could be utilized, as well. Varying doping properties achieved by ion implantation can be utilized for implementation of enhancement or depletion type devices.

Referring now to the right hand portion of FIG. 2, bipolar transistor 52 is illustrated as an NPN transistor including emitter region 83, base region 84 and collector region 85. Electrodes 87, 88 and 89 are associated, respectively, with the emitter, base and collector of the transistor, again in conventional fashion. It should be recognized that the transistor is a vertical semiconductor device formed in a pedestal fashion.

The elements of FIG. 2 are illustrated in FIG. 3 by like numerals. In addition, a substrate electrode 95 is similarly illustrated.

Figure 1A:
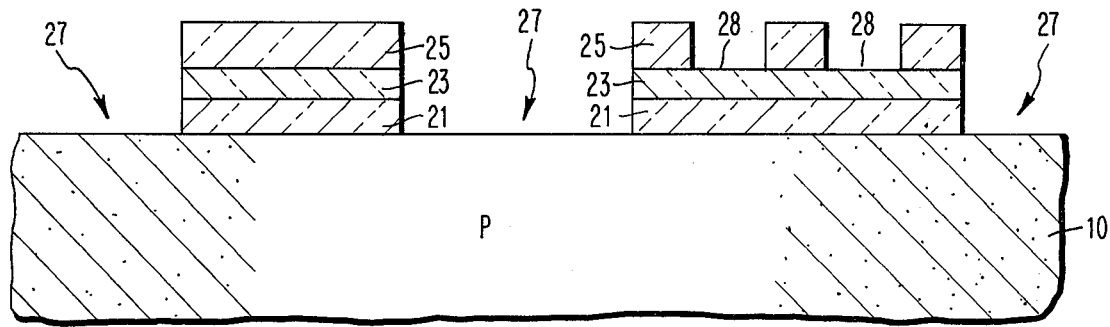
FIGS. 1A through 1E illustrate sectional views of a semiconductor chip illustrating various stages attained in the process used to produce one preferred embodiment of the present invention.

Referring now to FIGS. 1A-1E the process for fabricating the embodiment illustrated in FIGS. 2 and 3 is described. Wafer 10, particularly illustrated in FIG. 1A is a highly polished starting wafer of (100) crystal orientation P type silicon material having a typical resistivity of about 2 ohm-centimeters. After the surface of wafer 10 is cleaned, a layer 21 of thermal silicon dioxide is grown thereon in the usual manner, which may be by placing the silicon body in an oxidizing atmosphere at an elevated temperature with or without the addition of water vapor to the oxidation atmosphere. In a preferred embodiment, the thermal oxide could be grown, for example, under typical high temperature conditions to a thickness of about 300A. A layer could also be formed, alternatively, by other known techniques such as pyrolytic deposition of silicon dioxide or other well known insulating materials.

Following the deposition of layer 21, a layer 23 of silicon nitride $Si_3N_4$ is deposited using conventional techniques. For example, the silicon nitride can be deposited using pyrolytic deposition under typical conditions of about 800° C to a preferred thickness of about 300A.

Following deposition of layer 23, a layer 25 of pyrolytic silicon dioxide is deposited upon layer 23. This deposition is again carried out under typical high temperature conditions to deposit a layer about 1,000A thick.

Following deposition of layer 25, openings are formed in layers 21, 23, and 25 in areas selected to be the dielectric regions isolating the field effect transistor devices to be formed on the wafer. The openings selected for that purpose are generally indicated by numeral 27 in FIG. 1A, for example. Openings 27 are created by etching the silicon dioxide, silicon nitride and thermal silicon dioxide layers utilizing standard etchants including a buffered ammonium fluoride solution of hydrofluoric acid and heated phosphoric acid. Openings 28 are then formed by etching away pyrolytic silicon dioxide layer 25 in areas selected to be dielectric regions isolating the bipolar semiconductors whereby a mesa is formed in the center of the etched area. This etching step can be carried out in the same manner as the previous etching step.

Figure 1B:
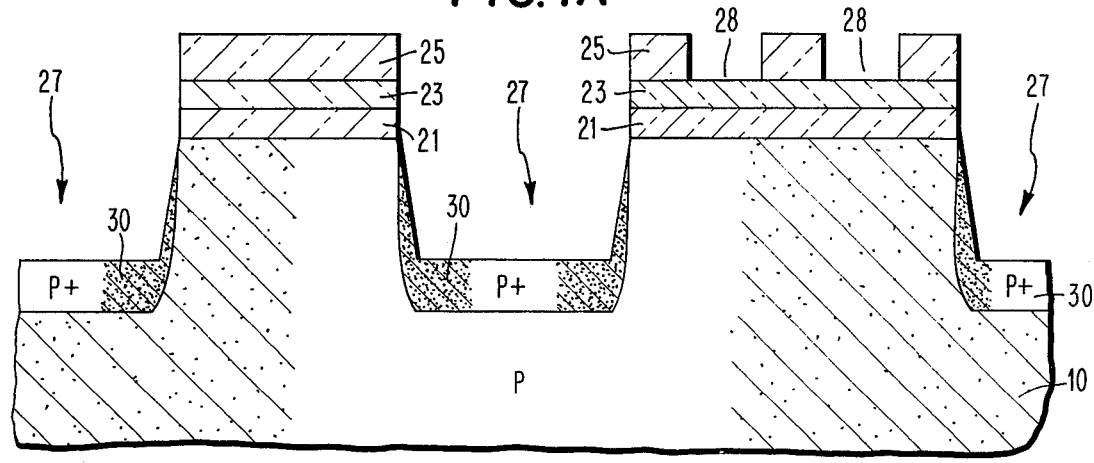

The exposed silicon at the bottom of areas 27 is then etched using isotropic or anisotropic silicon etch. Following that step the silicon beneath openings 27 is doped with a boron diffusion or ion implanted to form P+ regions 30 within the silicon as best illustrated in FIG. 1B. The P doped regions under the oxide should have concentrations in the range of $10^{17}$ impurity atoms per cubic centimeter. Following the diffusion step a thick silicon dioxide layer 32 is grown in regions 27 under typical high temperature conditions with steam. The thick oxide is preferably in the order of 10,000A thick and is grown to the level of layer 21, so that it merges therewith. It should be recognized that the earlier diffusion step produces non-vertical sidewalls in recessed area 27 which remain after growth of silicon dioxide layer 32.

Upon completion of silicon oxide growth in areas 27, nitride layer 23 and silicon dioxide layer 21 are removed from regions 28 by dip etching in conventional fashion.

Figure 1C:
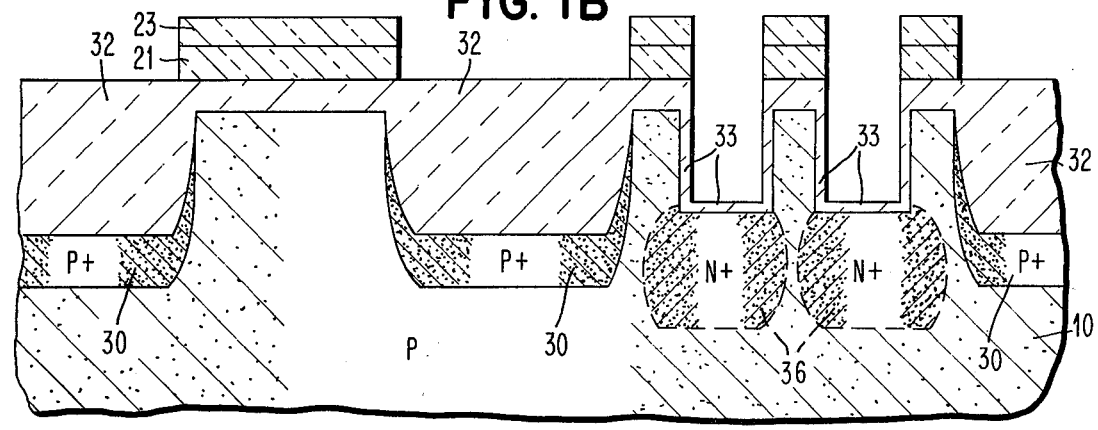

Following that step the surfaces defining regions 28 are etched by reactive ion etching to the depth illustrated in FIG. 1C in a fashion that defines an emitter and base region for the bipolar device having vertical sidewalls. The reactive ion etching is conventionally accomplished by accelerating ions in a highly evacuated chamber which impact the workpiece and remove materials in selected areas determined by suitable masks. For example, silicon can be etched in a $CF_4$ atmosphere with a pressure up to 100 millitorr and power in the range of 1 watt/cm$^2$ at an etch rate in the range of 200 - 800A per minute. The formation of the emitter base region of the bipolar transistor by such reactive ion etching is preferred since it results in a narrower more evenly dimensioned pedestal with vertical sidewalls than can be achieved through other processes. This structure, in turn, results in an improved bipolar device which is faster and has more equal gain in normal and inverse modes of operation. Finally, the formation of a narrow pedestal facilitates the merger of N+ subcollector regions formed beneath the pedestal in a manner described hereinafter. A screened silicon dioxide layer 33 is then grown on the bottom and sidewalls of the collector region surrounding areas 28 using conventional high temperature conditions to a layer about 1,000A thick.

Following the above step an ion implantation step is carried out for the purpose of implanting phosphorous or arsenic ions in the silicon beneath openings 28 to form N+ subcollector regions 36. It should be noted that the screened oxide layer 33 on the vertical sidewalls masks the N+ implant during this procedure. A satisfactory doping concentration for the N+ diffusions is about $10^{20}$ atoms/cc.

Figure 1D:
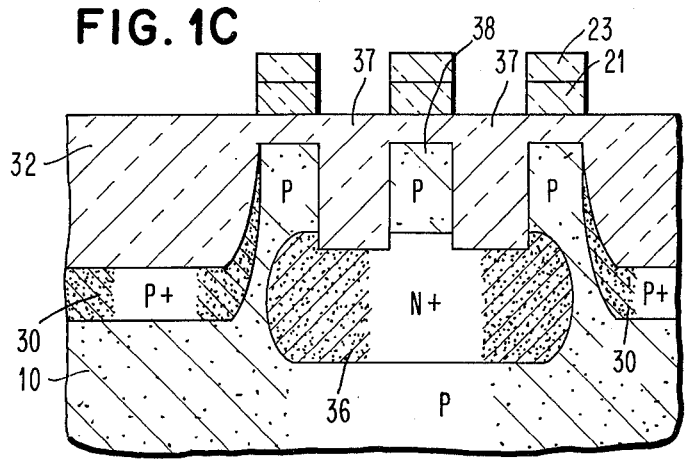
Figure 1E:
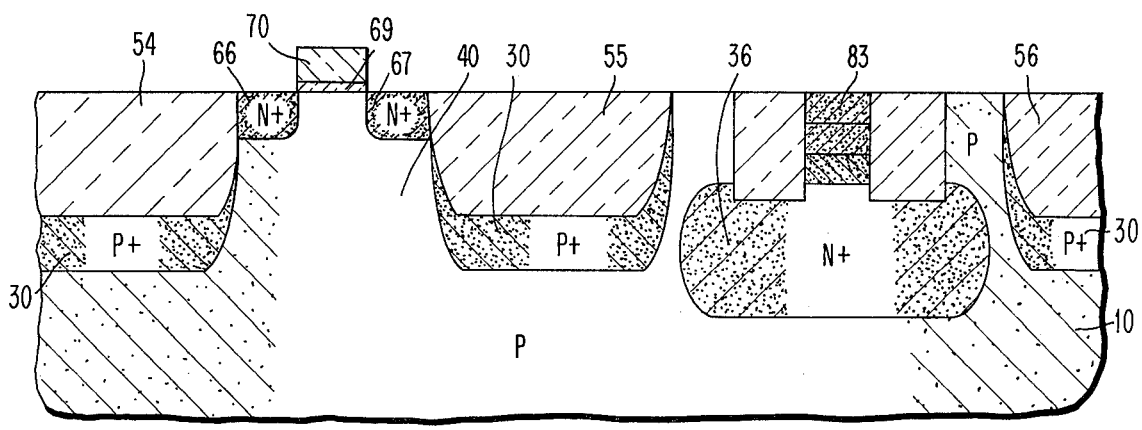

Following the implantation step, a thick silicon dioxide layer 37 is grown in openings 28 under typical high temperature conditions with steam, to a layer in the order of 10,000A in thickness. This, in turn, causes the N+ subcollector regions 36 to merge as illustrated in FIG. 1D, thereby isolating a P region 38 which forms a pedestal in which a bipolar transistor can be formed. Following the above mentioned steps, a field effect transistor is formed in region 40 between the recessed oxide regions 54, 55, as illustrated in FIG. 1E. As preliminary step a P+ diffusion can be done in region 38 to reduce the base resistance of the bipolar device to be formed therein.

In forming the field effect transistor, an N channel silicon gate device is fabricated by forming N+ source and drain regions 66, 67, respectively at the same time an emitter 83 is formed in region 38. The N+ regions can be formed by conventional ion implantation techniques, for example. Satisfactory doping concentrations are in the range of $10^{20}$ atoms/cc.

Following diffusion of the source and drain regions of the field effect transistor, a thermal oxide layer 82 is grown over the source, drain, emitter and base regions under high temperature conditions to a thickness of about 5,000A. This is followed by a dip etching step used to remove the nitride layer 23 and oxide layer 21 in the area of the gate region of the field effect transistor. A layer 69 of silicon dioxide is then thermally grown in the gate region to a thickness of about 500A, forming the gate insulator of the field effect transistor. A polycrystalline gate layer 70 is then deposited and defined using conventional etching techniques, to complete the gate structure. An alternative gate structure can be utilized comprising a metal gate formed during the contact definition step.

Electrode contacts are then provided to the devices as follows, source 73, gate 71, drain 74, emitter 87, base 88, subcollector 89, and substrate isolation 95, as illustrated in FIGS. 2 and 3. These contacts are formed in contact openings using conventional etching techniques following which electrode metal is deposited and etched in well known fashion. In the preferred embodiment aluminum electrode metal is utilized. However, it should be recognized that other suitable electrode metals could be utilized as well.

The process and structure described herein are advantageous in that both field effect transistor and bipolar transistor devices are formed on the same semiconductor chip using a process that does not require an epitaxial layer. The field effect transistor and bipolar devices are dielectrically isolated from each other in the fashion illustrated in the FIG. 2 by a process which is believed to be greatly simplified with respect to other processes capable of forming the structure illustrated.

The fabrication of bipolar devices without an epitaxial layer and by means of a reactive ion etching step eliminates the usual auto doping problem and results in higher yields of devices having preferred characteristics, such as uniform gain in both normal and inverse load of operation.

While the invention has been particularly shown and described with reference to the preferred embodiments thereof, it will be understood by those skilled in the art that various changes in form and details may be made therein without departing from the spirit and scope of the invention.

We claim:

1. Method for manufacturing an integrated circuit structure having dielectrically isolated regions containing bipolar and field effect transistor devices comprising:

providing a silicon monocrystalline substrate;
   etching said silicon in the areas to be the dielectric regions isolating the said field effect transistor devices;
   oxidizing the exposed silicon in said regions to form first oxidized areas;
   etching said silicon in the areas to be the dielectric regions isolating the said bipolar devices to form a mesa in the center of the etched area;
   oxidizing the exposed silicon areas to form a screen oxide area;
   ion implanting impurities through said screen oxide areas to form the subcollector for a bipolar device;
   growing thick silicon dioxide in said screen oxide areas to completely fill the areas with silicon dioxide and complete said dielectrically isolated regions;
   simultaneously forming the source, drain and emitter regions of said devices;
   forming gate insulator and gate electrodes for said field effect transistor devices;
   forming electrical contacts to said source, drain, gate, emitter, base and, collector of said devices.

2. The method of claim 1 wherein, after formation of the source, drain and emitter regions a layer of insulating material is deposited over the source and drain regions of the field effect transistor to form an insulating layer therefor.

3. A method of claim 1 wherein, a semiconductor chip has a resistivity of about 2 ohms-centimeter and source, drain and emitter regions are formed by diffusion of an impurity material resulting in a dopant concentration of about $10^{20}$ atoms/cc.

4. The method of claim 1 wherein, prior to formation of said emitter region, an impurity material is diffused into the region selected to be the base of the bipolar transistor to lower the base resistivity thereof.

5. The method of claim 1 wherein, said semiconductor chip is of P material and said source and drain are N+ diffusions.

6. The method of claim 1 wherein, the semiconductor chip is of P material and the bipolar transistor is an NPN device.

7. The method of claim 1 wherein the step of etching silicon in the areas to be dielectric regions isolating the bipolar transistor is effected by reactive ion etching.

* * * * *